United States Patent
Coy et al.

[19]

[11] Patent Number: 5,973,522
[45] Date of Patent: Oct. 26, 1999

[54] CURRENT INJECTED RAMP WITH REDUCED RECOVERY TIME BACKGROUND OF THE INVENTION

[75] Inventors: Bruce Harrison Coy, San Diego; Kenneth Smetana, Escondido, both of Calif.

[73] Assignee: Applied Micro Circuits Corporation, San Diego, Calif.

[21] Appl. No.: 09/019,224

[22] Filed: Feb. 5, 1998

[51] Int. Cl.[6] .................................................. H03K 19/084
[52] U.S. Cl. ........................................... 327/132; 327/131
[58] Field of Search ..................................... 327/131–138, 327/140, 170, 91, 94, 95, 97, 143, 198, 365, 182, 183, 392, 393, 394, 395, 399, 401

[56] References Cited

U.S. PATENT DOCUMENTS

| | | | |
|---|---|---|---|
| 3,411,153 | 11/1968 | Steele | 340/347 |
| 4,409,494 | 10/1983 | Smith | 307/238.3 |
| 4,421,995 | 12/1983 | Gottschalk | 327/365 |
| 4,503,396 | 3/1985 | Fawkes | 328/127 |
| 4,739,192 | 4/1988 | Price, Jr. | 307/362 |
| 4,774,497 | 9/1988 | Taylor | 341/118 |
| 4,779,013 | 10/1988 | Tanaka | 307/443 |
| 4,885,585 | 12/1989 | Barrow et al. | 341/169 |
| 4,950,929 | 8/1990 | Yan | 307/491 |
| 5,025,176 | 6/1991 | Takeno | 327/91 |
| 5,241,221 | 8/1993 | Fletcher et al. | 307/263 |
| 5,329,175 | 7/1994 | Peterson | 307/443 |
| 5,406,215 | 4/1995 | Asahina | 326/27 |
| 5,483,183 | 1/1996 | Dunn et al. | 327/140 |
| 5,502,410 | 3/1996 | Dunn et al. | 327/140 |
| 5,514,979 | 5/1996 | Collins et al. | 326/27 |
| 5,517,143 | 4/1996 | Gross | 327/108 |
| 5,585,795 | 12/1996 | Yuasa et al. | 341/118 |
| 5,617,051 | 4/1997 | Bingham | 327/317 |
| 5,627,486 | 5/1997 | Gross | 327/108 |
| 5,633,637 | 5/1997 | Noro | 341/144 |
| 5,825,218 | 10/1998 | Colli et al. | 327/134 |

*Primary Examiner*—Toan Tran
*Attorney, Agent, or Firm*—Gray Cary Ware Friedenrich

[57] ABSTRACT

A ramp circuit discharges an output capacitor to generate a substantially linear ramp signal, current injection is used to stabilize the ramp's output, reducing overshooting and ringing. With faster output stabilization, the ramp exhibits significantly faster repetition rates suitable testing high speed components such as RAM, microprocessors, high speed logic, and the like. The ramp includes an output transistor, with its output defining an output node coupled to a current source and a charge storage device such as a capacitor. The charge storage device charges when the transistor is "on". Namely, when the transistor is turned on, the output charge storage device is coupled to a reference voltage, which charges the device in a fixed time. When the transistor is turned "off", the charge storage device discharges, aided by the flow of current through the current source, resulting in the linear ramp signal. After the charge storage device discharges, current injection is used to quickly stabilize the ramp's output. Particularly, while the output transistor is turned on, permitting the charge storage device to recharge, a transistor couples a bias current source to the output node. Specifically, the transistor is configured to selectively couple the bias current source to the output node when the output transistor is turned on, or a predetermined time thereafter. Conversely, the transistor selectively decouples the bias current source from the output node when the ramp output arrives within a predetermined threshold value of the target ramp starting value.

20 Claims, 7 Drawing Sheets

TIMING EVENT

*Fig. 8C*

RESET SIGNAL

*Fig. 8D*

BIAS TRESHOLD
SENSOR OUTPUT

*Fig. 8E*

SWITCH CONTROL OUTPUT

CURRENT INJECTED RAMP WITH REDUCED RECOVERY TIME

BACKGROUND OF THE INVENTION

BACKGROUND OF THE INVENTION

1. Field of the Invention

The present invention relates to electronic timers for generating precise timing signals. More particularly, the invention concerns a timing vernier employing a current injected ramp to reduce recovery time, enabling faster retriggering.

2. Description of the Related Art

Electronic timers are widely used in many different applications. For example, electronic clocks generate carefully defined, high speed clock cycles necessary to operate digital computers. Timers are also an integral component of test circuits that measure and evaluate operational characteristics of circuits such as memory, microprocessors, high speed logic circuits, and the like. This type of test circuit is often implemented in an automatic test equipment board, which frequently includes both digital and analog circuits.

In this context, engineers have developed a class or circuits called "timing verniers", which provide finely adjustable timing signals. Timing verniers are often sold as a "macro" item, selected by a customer for use in an application specific integrated circuit along with other desired components.

There are many known timing verniers, one class of which is exemplified by the model PDS01S product manufactured by Applied Micro Circuits Corp. (AMCC). This class of timing vernier includes a number of components, shown in simplified block form in FIG. 1. Namely, the timing vernier 100 includes a ramp 102, digital-to-analog converter (DAC) 104, comparator 106, and threshold sensor 114. The ramp 102 produces an analog voltage signal (at output 103) that decreases at a prescribed linear rate. The signal at the output 103 may also be called a "ramp" signal. The DAC 104 provides a fixed analog timing signal select (at output 110) according to a digital timing select input signal (at input 108). When the comparator 106 determines that the ramp's decreasing output signal (at 103) reaches the fixed analog timing select signal 110, the comparator 106 produces a timing event. The timing event is a characteristic of the timing output signal, and may comprise a pulse, digital signal transition (i.e., high-to-low or low-to-high), or another recognizable signal characteristic. When the threshold sensor 114 determines that the ramp's decreasing output signal (at 103) matches the fixe reset select signal on the line 115, the sensor 114 issues a reset signal to the ramp 102, causing the ramp 102 to bring its output back to a predetermined starting level.

Figure 2:
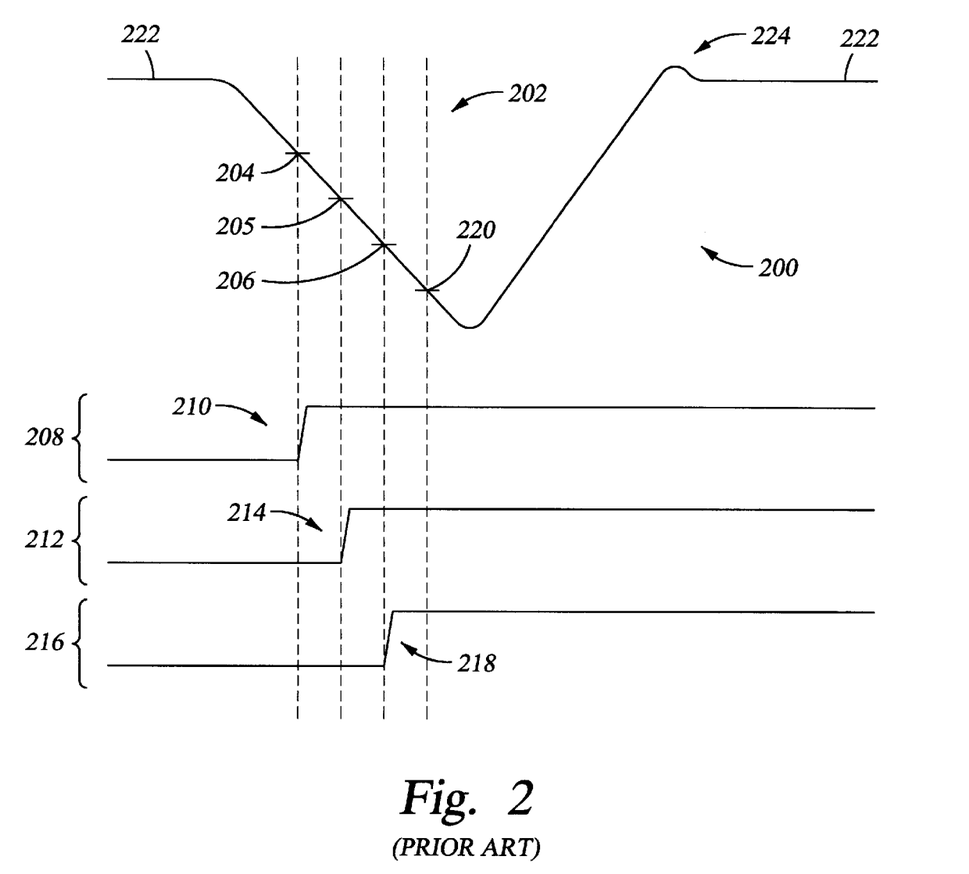
FIG. 2 is a timing diagram illustrating the operation of a known timing vernier.

FIG. 2 depicts a timing diagram illustrating the operation of the timing vernier 100. The output 103 of the ramp 102 is shown by the waveform 200. Starting from a predetermined starting value 222, the waveform 200 then provides an analog voltage decreasing at a constant level throughout a region 202 of the waveform 200. Several alternative analog timing select signals 110 are shown by the levels 204–206. Each different analog timing select signal is produced by changing the voltage of the digital timing select input signal 108. Different analog timing select signals produce timing events that occur at different times.

For example, if the digital timing select signal 108 is chosen to provide an analog timing select signal 204, the comparator 106 detects when the ramp signal 200 reaches the level 204 when this occurs, the output 112 of the comparator 106 exhibits a timing signal 208 including the timing transition 210. As a different example, the digital timing select signal 108 may be set to yield an analog timing select signal at the level 205. In this case, when the comparator 106 detects the ramp signal 202 reaching the level 205, the output 112 of the comparator 106 exhibits a timing signal 212 including the timing transition 214. Alternatively, the digital timing select signal 108 may instead be set to yield an analog timing select signal at the level 206. In this case, when the comparator 106 detects the ramp signal 202 reaching the level 206, the output 112 of the comparator 106 exhibits the timing signal 216 with the timing transition 218.

Figure 1:
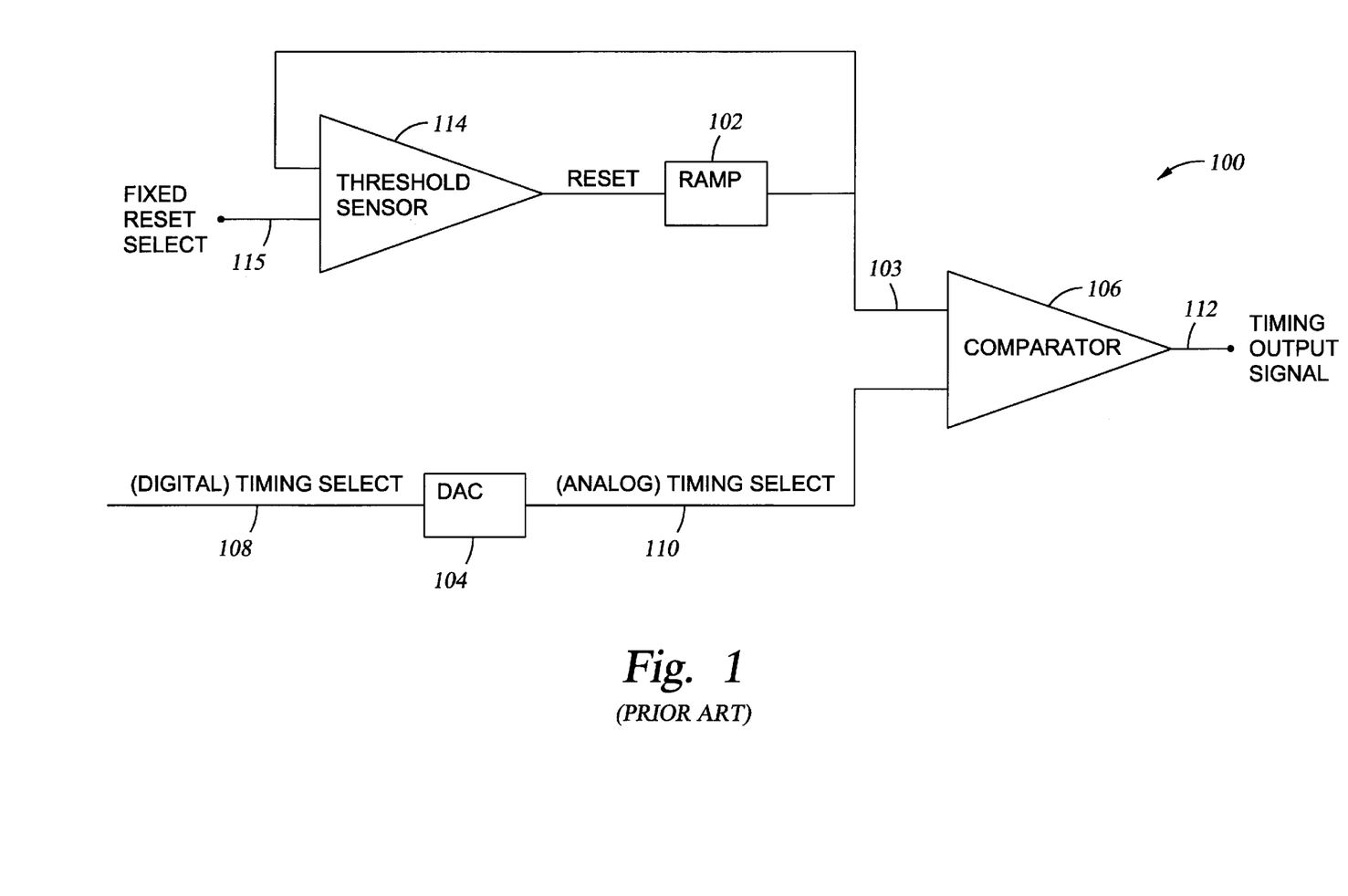
FIG. 1 is a block diagram of the hardware components and interconnections of a known timing vernier.

As shown in FIG. 1, the threshold sensor 114 is provided to recognize when the output signal 103 of the ramp 102 reaches a fixed threshold value 220, set by the input 115. When the output signal 103 reaches the value 220, the threshold sensor 114 resets the ramp 102, causing the ramp 102 to increase its output back to the predetermined starting value 222 (FIG. 2). There may be some delay in reaching the steady-state value 222 due to overshooting and/or ringing that occurs in a region 224 of the waveform 200.

Although known timing verniers such as the foregoing constitute significant advances and enjoy widespread commercial success today, AMCC has continually sought to improve the performance and efficiency of their timing verniers. One area of particular focus is the speed and signal resolution of timing signals. All timing verniers produce timing signals whose frequency is subject to some maximum value, beyond which the resultant timing signal may unreliable. If the timing signal is not sufficiently fast or crisp in definition, the circuit using the timing signal may produce inaccurate data.

Nonetheless, with the ever-increasing operating speeds of circuits to be tested, it is increasingly important to have timers that provide faster and more clearly defined timing signals. Consequently, advances are continually needed to boost the speed and resolution of timing signals.

SUMMARY OF THE INVENTION

Broadly, the present invention concerns a timing vernier including a ramp circuit that discharges an output capacitor to generate a substantially linear ramp signal. During recharging of the output capacitor, current injection is used to stabilize the ramp's output, significantly reducing overshooting and ringing. With faster output stabilization, the present circuit is capable of significantly faster repetition rates, unlike prior ramps. Thus, this invention is especially useful for testing high speed components such as RAM, microprocessors, high speed logic, and the like.

One aspect of the invention is a timing vernier, employing a ramp circuit capable of current injection. Generally, the ramp provides a substantially linearly changing output signal at a ramp output node responsive to signals on an input line. The ramp includes an output transistor, with its output coupled to a output current source and an output capacitor. The junction between the output transistor, output current source, and output capacitor forms a ramp output node. The output capacitor charges when the output transistor is "on", Namely, when the output transistor is turned on, the output capacitor is coupled to a reference voltage, which charges the output capacitor in a certain time. When the transistor is turned "off", the output capacitor discharges, aided by the flow of current through the output current source, resulting in the linear ramp signal.

A second current source, interposed between the output node and electrical ground, is selectively activated in response to an activating signal on a bias control input. During recharging of the output capacitor, the second current source is activated to perform current injection in order to quickly stabilize the ramp's output. Particularly, while the output transistor is turned on, permitting the output capacitor to recharge, the second current source is activated, causing an increase of bias current through the output transistor. Beneficially, this current injection boosts the bias current flowing in the output transistor, reducing ringing and overshooting.

In one embodiment, the second current source includes a switch in series with a bias current source. The switch is configured to selectively couple or decouple the bias current source to or from the output node.

Another component is a digital-to-analog converter (DAC), responsive to one or more digital inputs to provide analog signals including a timing select signal, the bias select signal, and the reset select signal. The DAC is used in conjunction with a number of sensors. A reset threshold sensor, is coupled to the ramp and the DAC, provides a reset signal to the bias control unit and the input line when the ramp output signal reaches the reset select signal. Similarly, a bias threshold sensor is coupled to the ramp and the DAC, to sense when the ramp output signal reaches the bias select signal.

A bias control unit manages activation of the second current source. The bias control unit provides an activating signal to the switch when the bias threshold sensor provides its output, indicating that the ramp output signal has reached the bias select signal. The bias control unit stops providing the activating signal when a predetermined "trigger" is received at the trigger input.

A comparator, coupled to the ramp and the DAC, produces a timing event when the ramp output signal substantially matches the timing select signal.

The invention affords its users with a number of distinct advantages. Chiefly, the invention enables extremely high speed clocking of fast circuit components. The bias current source creates an increased bias current through the output transistor, lowering the output transistor's output impedance. The bias current source also reduces the amount of dynamic current into the output charge storage device, thus decreasing overshoot and ringing in the ramp signal. Consequently, the ramp signal settles to its steady state value sooner, enabling earlier retriggering. The invention also provides a number of other advantages and benefits, which should be apparent from the following description of the invention.

DETAILED DESCRIPTION

The nature, objects, and advantages of the invention will become more apparent to those skilled in the art after considering the following detailed description in connection with the accompanying drawings. As mentioned above, the invention concerns a timing vernier with a current injected ramp that reduces recovery time, enabling faster retriggering.

ANALYSIS OF RAMP CHARACTERISTICS

The present inventors have discovered that one potential problem area with timing verniers such as the unit 100 is the ramp 102. In particular, ramp signals produced by the ramp 102 include certain imperfections that prevent sufficiently rapid retriggering to satisfy certain high speed applications.

Figure 3:
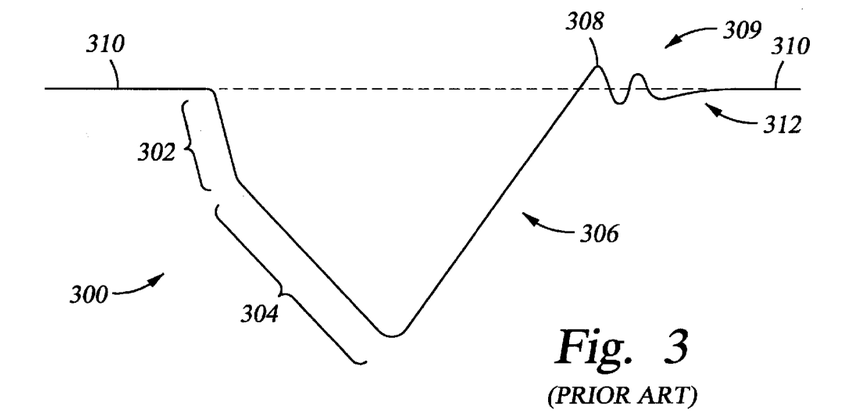
FIG. 3 is a timing diagram illustrating a known ramp signal.

FIG. 3 shows a detailed look at an exemplary ramp output signal 300. From a steady state D.C. value 310, the signal 300 exhibits a generally linear voltage drop in a range 304. However, due to certain electrical characteristics of the ramp 102, a relatively brief nonlinear region 302 appears in the output signal 300. Namely, the region 302 exhibits a quick drop in the ramp signal compared to the following period 304 of slower, steady state decrease. Although the region 302 itself might be linear, it is nonlinear with respect to the majority of the signal 300 including the region 304.

Consequently, the useful range of the ramp 102 does not begin until the linear range 304 commences. As discovered by the present inventor, this initial wasted time (during region 302) lengthens the entire cycle of the ramp signal 300, preventing an otherwise faster retrigger rate. This problem is remedied by the invention disclosed in U.S. patent application No. 09/019,521, filed herewith, entitled "Charge Balanced Ramp With Improved Signal Linearity", in the name of Bruce Coy. The foregoing patent application is hereby incorporated by reference in its entirety.

Another potential problem area with known ramp circuits, preventing sufficiently quick retriggering, is the ramp signal's slow recovery time. Referring again to Figure, after the ramp's linear drop 304, the output signal rises as shown by 306 while an output capacitor of the ramp is recharged. As recognized by the present inventors, arrival of the rising output signal 306 at its steady state D.C. value 310 is not fast enough for some particularly high speed applications. One reason is that the signal 300 overshoots the target D.C. value 310, as shown by 308. The signal 300 may also experience ringing 309, marked by a period of diminishing oscillation about the target D.C. value 310. After the region 308, the signal 300 gradually inches toward the target D.C. value 310 during a region 312.

Figure 4:
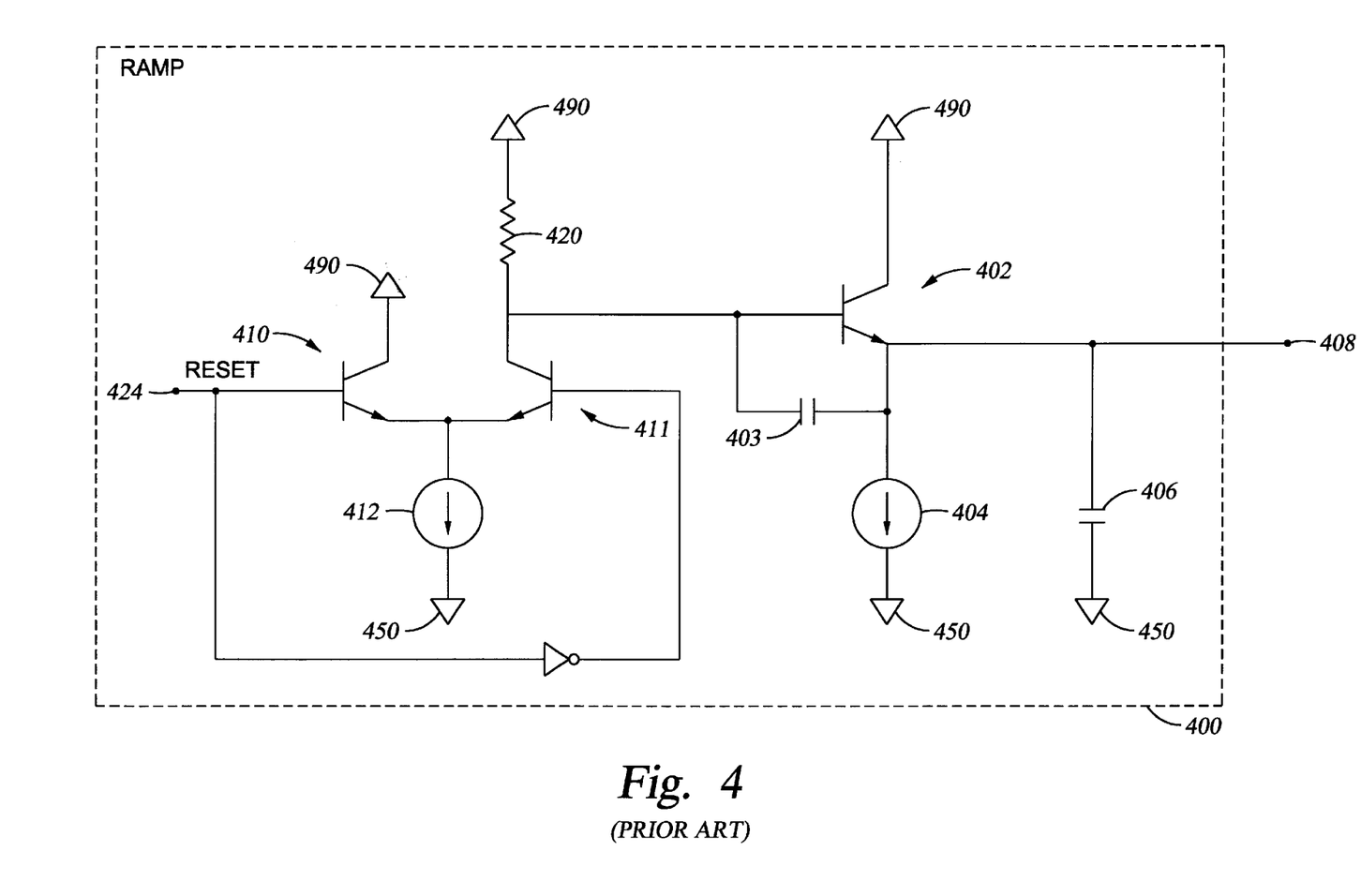
FIG. 4 is a schematic diagram showing the hardware components and interconnections of a known ramp circuit.

To improve upon conventional ramp design, the present inventors undertook a detailed study of such ramp circuits, an example of which is shown by the ramp circuit 400 of FIG. 4. As typically implemented, the ramp circuit 400 includes an output transistor 402 whose emitter provides the output 408 of the ramp 400. The transistor 402 is typically a bipolar junction transistor. A current source 404 and a capacitor 406 are coupled between the output 408 and electrical ground 450. The transistor 402 receives power from a fixed power supply voltage 490.

The ramp 400 also includes input transistors 410–411, which are also bipolar junction transistors. The emitters of the transistors 410–411 are interconnected. A current source 412 is coupled between the interconnected emitters and electrical ground 450. The collector of the transistor 410 receives power from the fixed power supply voltage 490. The collector of the transistor 411 is coupled to the base of the transistor 402, and also to the power supply voltage 490 via a pull-up resistor 420. The base of the input transistor 411 receives the inverse of the signal provided to the other input transistor's base at 424.

Using the foregoing analysis, the present inventors recognized that the overshoot 308 and ringing 309 is caused by the transistor 404 acting like an inductor, which in cooperation with the capacitor 406, creates resonance. The inventors have discovered that this effect can be avoided by boosting the current flow through the output transistor during recharging of the charge storage device. Thus, one aspect of this invention is a ramp that includes circuitry selectively providing current injection during recharging of the output charge storage device, as discussed in detail below. To illustrate an example of this ramp, FIG. 5 depicts a current injected ramp 500, as discussed in detail below.

CURRENT INJECTED RAMP: HARDWARE COMPONENTS & INTERCONNECTIONS

Timing Vernier: Components

Figure 5:
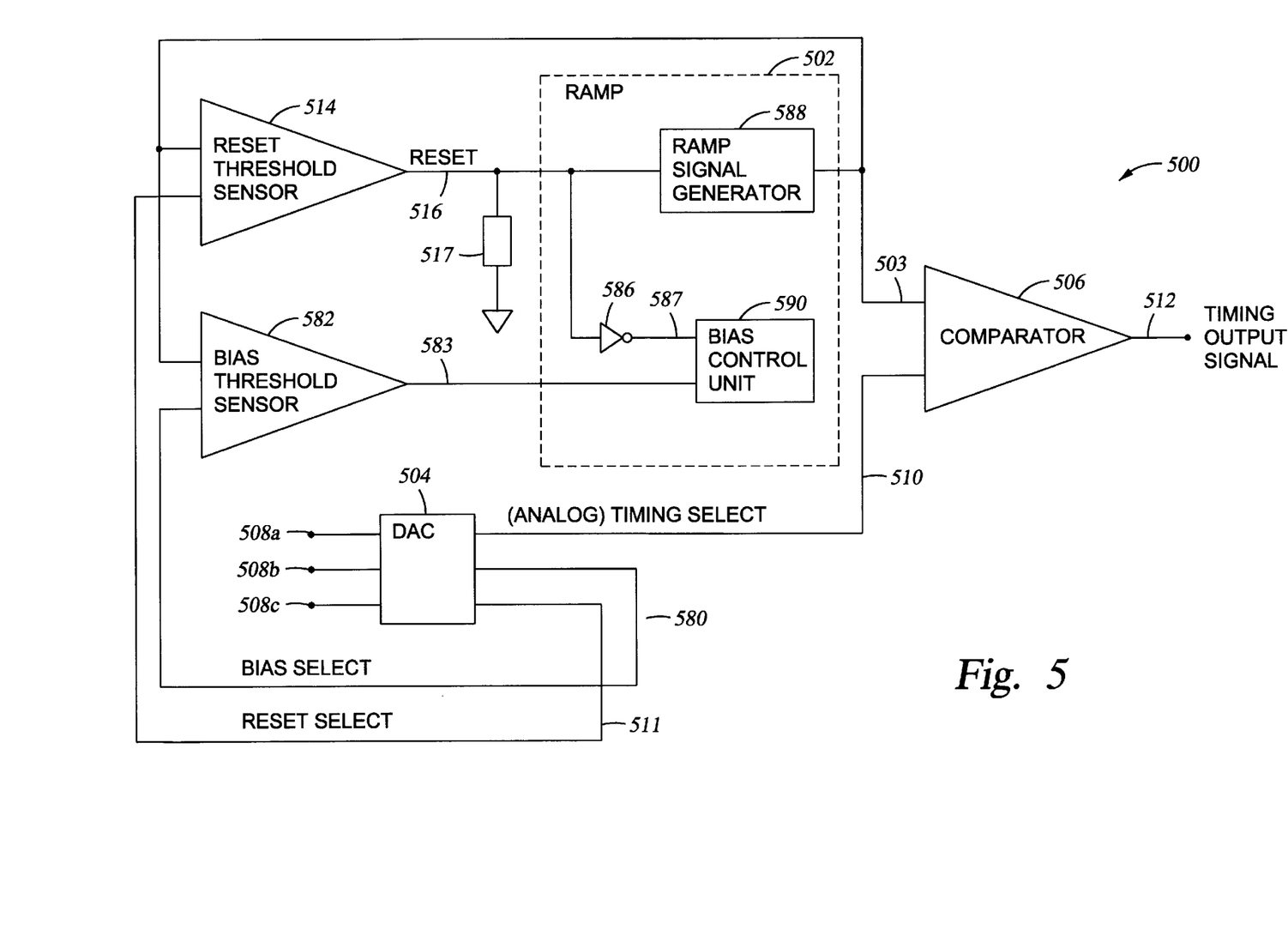
FIG. 5 is a schematic diagram showing some of the hardware components and interconnections of a timing vernier employing a current injected ramp according to the present invention.

FIG. 5 shows a timing vernier 500, which includes a number of particularly valuable features. These features include, among others, the addition of current injection and bias control circuitry to the ramp, modification of the DAC to provide additional outputs, and addition of reset and bias threshold sensors. Generally, the timing vernier 500 includes a ramp 502, a digital-to-analog converter (DAC) 504, a comparator 506, a reset threshold sensor 514, and a bias threshold sensor 582.

Ramp Circuit

The ramp circuit 502 produces an analog ramp output signal at a ramp output 503. As illustrated, the ramp output signal is an electrical voltage, but may alternatively comprise an electrical current, or another electrical property. The ramp output signal starts at a predetermined voltage level, and changes substantially linearly at a prescribed linear rate, e.g. one volt/nanosecond. The ramp signal may change by decreasing or increasing, depending upon the particular application. In the illustrated embodiment, the ramp circuit 502 provides a decreasing signal. The ramp may be implemented by discrete circuit components, a new or commercially available integrated circuit, or a macro supplied for incorporation into an application specific integrated circuit (ASIC).

The commencement of the changing ramp output signal occurs in response to the ramp 502 receiving a "trigger" signal on the line 516. In the illustrated embodiment, the "trigger" signal constitutes a binary zero, whereas a "reset" signal is provided by a binary one on the line 516. In contrast to the trigger signal, which initiates the changing ramp signal, the reset signal stops the ramp signal from changing and causes the ramp to reset to its predetermined starting value.

The ramp 502 includes a ramp signal generator 588, bias control unit 590, and inverter 586. As explained in greater detail below, the ramp signal generator 588 actually generates the linearly changing ramp output signal. The ramp signal generator 588 includes circuitry (discussed below) to selectively increase current through its output transistor, in response to control signals provided by the bias control unit 590.

More specifically, the signal on the line 516 either represents a "reset" signal (a binary one, as illustrated) or a "trigger" signal (a binary zero, as illustrated). The trigger signal causes the ramp to begin its linearly changing ramp cycle, and the reset signal causes the ramp to stop and reset itself to its starting voltage level. The inverter 586 inverts the signal on the line 516, so that a binary one on the 587 (binary zero on the line 516) causes the bias control unit 590 to activate bias current injection.

The ramp 502 may be manufactured in various ways. For instance, the ramp 502 may be implemented using discrete circuit components, a new or commercially available integrated circuit, an application specific integrated circuit, or a "macro" supplied for incorporation into an ASIC.

DAC

In the illustrated embodiment, the DAC 504 provides three output signals at corresponding outputs 510, 580, and 511. On the output 510 the DAC 504 provides an analog timing select signal, comprising a D.C. analog output signal representative of a digital timing select input signal received on an input 508a. In other words, the DAC 504 converts the digital signal received on the input 508a into an analog signal on the output 510.

At the output 580, the DAC 504 produces a bias select signal. As illustrated, the bias select signal may be an analog representation of a digital input signal received on a line 508b. Alternatively, the bias select signal may comprise a D.C. analog signal that differs by a fixed amount from the timing select signal on the output 510. As still another alternative, the bias select signal 580 may alternatively be generated to differ a fixed amount from the reset select signal 511, as the reset select signal 511 also differs a fixed amount from the analog timing select signal (as discussed below).

In one example, where the ramp output signal decreases, the bias select signal 580 may be slightly less than the reset select signal 511 to quickly introduce bias injection current into the ramp signal generator 588 soon after the ramp is reset. As a specific example, where the ramp signal comprises a voltage, the bias select signal 580 may be equal to the reset select signal 511 reduced by a predetermined voltage, such as about 20–50 millivolts. Alternatively, even with a decreasing ramp output signal, the bias select signal 580 may be greater than the reset select signal 510 to account for any reset delay inherent to the ramp circuit.

At the output 511, the DAC 504 produces a reset select signal. As illustrated, the reset select signal may be an analog representation of a digital input received on a line 508c. Alternatively, the reset select signal may comprise a D.C. analog signal that differs by a fixed amount from the timing select signal on the output 510. In one example, where the ramp output signal decreases, the reset select signal 511 may be slightly less than the signal 510 to provide quick resetting of the ramp after generating the timing event. Alternatively, even with a decreasing ramp output signal, the signal 511 may be greater than the signal 510 to account for any reset delay inherent to the ramp circuit 502. As a specific example, where the ramp output signal comprises a voltage, the reset select signal (output 511) may be equal to the timing select signal (output 510) reduced by a predetermined voltage, such as about 20–50 millivolts.

The DAC 504 may be implemented by discrete circuit components, a new or commercially available integrated circuit, or a macro supplied for incorporation into an ASIC. A more detailed illustration of one DAC embodiment is shown below.

Comparator

The comparator 506 produces a predetermined timing event on the output 512 when the ramp's changing output signal 503 reaches the analog timing select signal 510. At this time, the comparator 506 generates the timing event on the output 512. The timing event, may comprise any sufficiently distinct electrical characteristic such as pulse, digital signal transition (i.e., high-to-low or low-to-high), zero voltage crossing, or any another distinguishable signal characteristic.

The comparator 506 may be implemented by discrete circuit components, a new or commercially available integrated circuit, or a macro supplied for incorporation into an ASIC.

Reset Threshold Sensor

The reset threshold sensor 514 receives the reset select signal 511 and the ramp output signal 503. The reset threshold sensor 514 compares these signals to recognize when the ramp output signal 503 matches the reset select signal 511. When this occurs, it is time to reset the ramp 502, causing the ramp 502 to increase the ramp output 503 back to its predetermined starting value. As mentioned above, the reset signal generated by the reset threshold sensor 514 under these circumstances comprises a binary one in the illustrated embodiment. Unlike prior arrangements, the ramp 502 may be reset very soon after the ramp output signal reaches the analog timing select value 510, without waiting for the ramp signal output to reach some fixed minimum value.

In the illustrated embodiment, the reset threshold sensor 514 provides its reset signal output (binary one) when the ramp output signal 502 matches the reset select signal 511, and continues to provide this output until the line 516 is reset by the trigger circuit 517 as discussed below.

The reset threshold sensor 514 may be implemented by discrete circuit components, a new or commercially available integrated circuit, or a macro supplied for incorporation into an ASIC. As one example, the reset threshold sensor 514 may comprise a comparator similar to the comparator 506.

Bias Threshold Sensor

The bias threshold sensor 582 receives the bias select signal 580 and the ramp output signal 503. The bias threshold sensor 582 compares these signals to recognize when the ramp output signal 503 matches the bias select signal 580. When this occurs, the bias threshold sensor 582 provides an output signal on line 583 to the bias control unit 590. In the illustrated embodiment, the output signal of the bias threshold sensor 582 comprises a pulse of a predetermined duration. In response to this signal, the bias control unit 590 instructs the ramp signal generator to begin charge injection, as discussed in greater detail below.

The bias threshold sensor 582 may be implemented by discrete circuit components, a new or commercially available integrated circuit, or a macro supplied for incorporation into an ASIC. As one example, the bias threshold sensor 582 may comprise a comparator similar to the comparator 506.

Trigger Circuit

The timing vernier 500 also includes a trigger circuit 517, which serves to selectively bring the signal on the line 516 to a low voltage, i.e., binary zero. The low voltage at the line 516 constitutes a "trigger" signal, which serves to initiate the ramp cycle of the ramp signal generator, from its initial, steady state starting value.

As an example, the trigger circuit 517 may comprise a transistor or another suitable circuit to selectively reduce the voltage on the line 516 to a logic zero. The trigger circuit 517 may be activated on any appropriate basis, such as on a periodic basis (e.g., 800 MHZ), or at user selected times. Thus, the trigger signal occurs on a periodic or other basis (to start the ramp cycle), but the reset signal occurs automatically when the ramp output signal matches the analog timing select signal (to reset the ramp signal back to its starting value).

DAC: More Detail

As mentioned above, the DAC 504 receives a digital timing select signal, and provides (1) an analog timing select signal 510 corresponding to the digital timing select signal 508, (2) a reset select signal 511, corresponding to the signal on the input line 508c, and (3) a bias select signal 580 corresponding to the signal on the input line 508b. As an alternative, the DAC 504 may automatically provide a reset select signal 511 and bias select signals 580 each offset by predetermined amounts from the timing signal 510.

According to the invention, the foregoing functions may be implemented using many different embodiments of circuitry. As one example, the inventive DAC 504 may be implemented by using one or more DACs disclosed in U.S. patent application No. 09/019,526, entitled "Timer With Dynamic Reset Threshold", filed herewith in the names of Bruce Harrison Coy et al., and assigned to Applied Micro Circuits Corp. The foregoing application is incorporated herein, in its entirety. This application discloses a DAC providing a first output voltage along with another output voltage offset from the first by a fixed amount.

Ramp Signal Generator: More Detail

Figure 6:
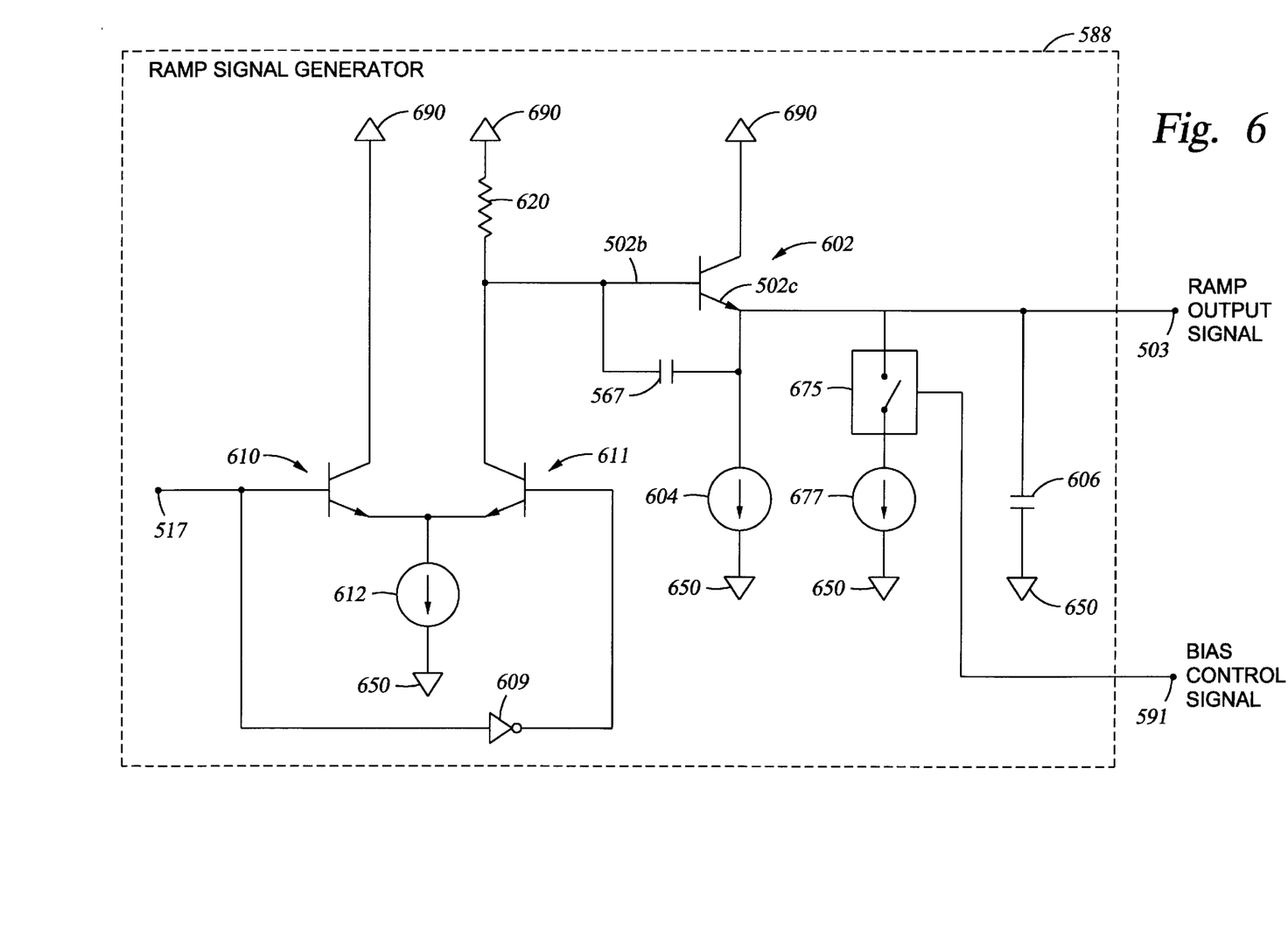
FIG. 6 is a schematic diagram showing specific circuitry embodying one current injected ramp according to the present invention.

FIG. 6 depicts the components of an exemplary ramp signal generator 588 in greater detail. One component of the ramp signal generator 588 is the output transistor 602. As illustrated, the transistor 502 comprises an NPN bipolar junction transistor, having a collector, base, and emitter. However, the element 602 may comprise a field effect transistor, arrangement of diodes, or any other suitable component(s) to provide a switch capable of supplying the ramp output signal 503.

As illustrated, the transistor 602 provides output signals at its emitter (also the ramp output 503) responsive to the input signal received at the transistor's base. The collector of the transistor 602 is coupled to a power supply 690 that provides a predetermined source voltage.

Between the output node 503 and electrical ground 650, a current source 604 and output capacitor 606 are interposed in parallel. Although the device 606 is illustrated as a capacitor, another suitable selectively dischargeable charge storage device may be used if available.

As a further component of the ramp signal generator 588, a bias current source 677 and switch 675 are interposed between the output node 503 and electrical ground 650. The switch 675 is selectively activated and deactivated at certain times, as discussed in detail below. Depending on whether the switch 675 is activated or deactivated, it couples and decouples the bias current source 677 to the output node 503. As explained below, activation of the switch is conducted in accordance with the signal on the line 591, received from the bias control unit 590. When the switch is closed, it helps increase the bias current flowing through the transistor 602, resulting in less overshoot and ringing during ramp signal recovery.

The ramp signal generator 588 may be implemented in various different embodiments, each using a different variety of subcomponents, as will be apparent to ordinarily skilled artisans having the benefit of this disclosure. For example, the individual components of the generator 588 may be changed in various ways. For instance, although the current sources 604/677 are shown providing electrical current flowing toward electrical ground 650, the ramp signal generator 588 may be alternatively designed with appropriate reference voltages and input signals so that the current sources provide current in the opposite direction.

Bias Control Unit: More Detail

Figure 7:
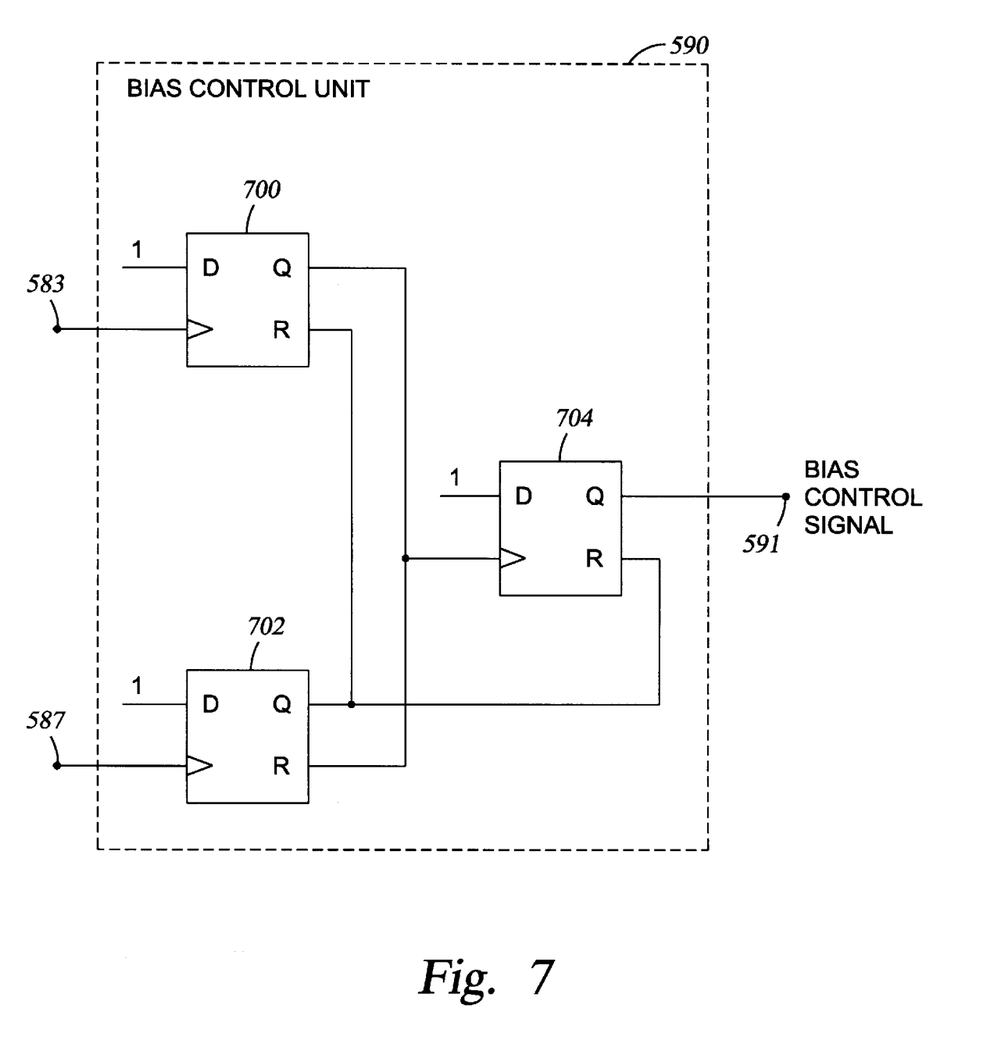
FIG. 7 is a schematic diagram showing one example of circuitry to implement a bias control unit according to the present invention.

FIG. 7 depicts the components of an exemplary bias control unit 590 in greater detail. As mentioned above, the bias control unit controls the activation of the switch 675, which determines when bias current is injected to the output node 503. In the illustrated application, it is generally desirable to add current injection after the ramp output signal crosses the ramp reset threshold to aid in resetting the ramp, and to cease current injection shortly before triggering the ramp signal generator 588. The injected current helps speed the return of the ramp output signal to its predetermined starting level, and also helps minimize any overshooting and ringing upon such return.

As illustrated embodiment, the bias control unit 590 is implemented with digital flip-flop circuits including a switch-control flip-flop 704, a switch-closed flip-flop 700, and a switch-open flip-flop 702. Output from the switch-control flip-flop 704 on the line 591 determines whether the switch 675 should be open or closed. As illustrated, a high voltage on the line 591 closes the switch (causing current injection) and a low voltage opens the switch (ending current injection).

The switch-closed flip-flop 700 activates when the switch 675 should be closed; namely, the flip-flop 700 is activated in response to binary one on the line 583, which corresponds to the ramp output signal reaching the bias select signal 580.

The switch-open flip-flop 702 activates when the switch 675 should be open; namely, the flip-flop 702 is activated in response to a high voltage on the line 587, indicating a "trigger" signal. The trigger signal is opposite the reset signal; when the signal on the line 516 is high, a "reset" condition is indicated, whereas a low voltage on the line 516 signals a trigger condition.

CURRENT INJECTED RAMP: OPERATION

In addition to the hardware embodiments described above, a different aspect of the invention concerns the operation of the invention's ramp.

General Description

Figure 8A:
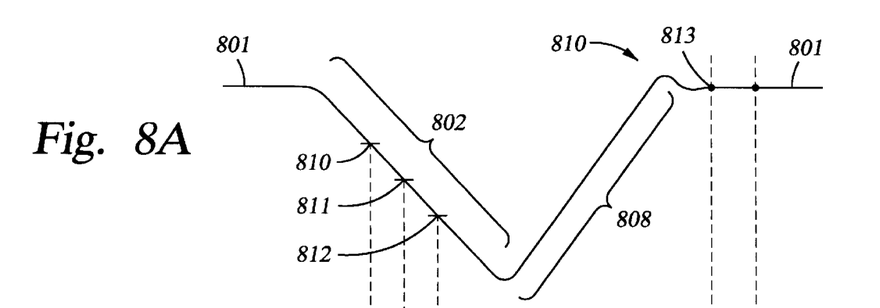
FIGS. 8A–8E depict timing diagrams illustrating the overall operation of a timing vernier with a current injected ramp, according to the invention.

The operation of the invention's current injected ramp is explained in greater detail with reference to FIGS. 5–7 and 8A–8E. Generally, the ramp circuit 502 produces an analog ramp output signal at the output 503. This signal is exemplified by the waveform 800 (FIG. 8A). The ramp output signal may be an electrical voltage, current, or another electrical property. The ramp output signal 800 exhibits fast recovery time, with significantly reduced overshoot and ringing, unlike previous ramp output signals.

The ramp output signal 800 signal begins at a predetermined steady state level 801. The initial level 801 is achieved by turning the transistor 602 "on", permitting the reference voltage 690 to charge the output capacitor 606. In response to a trigger signal, the ramp signal 800 decreases substantially linearly at a prescribed linear rate. More particularly, commencement of the decreasing ramp output signal occurs in response to the ramp signal generator 588 receiving a trigger signal from the line 516. When this occurs, the transistor 611 is turned on, bringing the base of the transistor 602 low, and thus turning the transistor 602 "off". This permits the output capacitor 606 to discharge. As the capacitor 606 discharges, the voltage at the output node 503 decreases in the range 802. During the discharge phase, the switch 675 is open, effectively deactivating the bias current source 677.

Figure 8B:
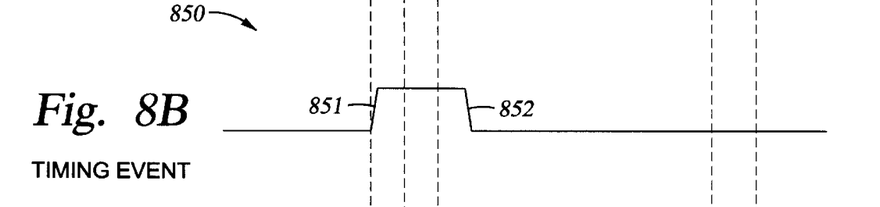

When the ramp's output signal 800 reaches the predetermined analog timing select voltage 510, the comparator 506 responsively generates its timing event at its output 512. FIG. 8B depicts the occurrence of the timing event 850. Particularly, the timing event as illustrated includes a rising edge 851 occurring in response to the ramp output signal 503 arriving at the timing select level 510. A predetermined time later, the timing event signal 850 exhibits a falling edge 852. In this embodiment, the timing event comprises a digital pulse. The timing event may comprise a different electrical signal characteristic, if desired, such as a signal transition, analog zero crossing, etc.

Figure 8C:
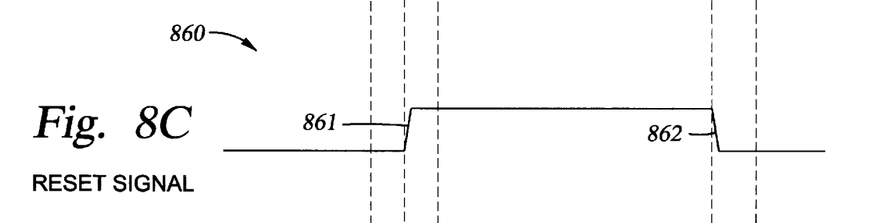

Next, when the signal 800 reaches the reset select voltage 511, the reset threshold sensor 514 senses this condition and provides a binary one signal to the ramp signal generator 588 and the inverter 586. FIG. 8C shows the output of the reset threshold sensor 514, comprising a reset signal 860. As shown, the reset signal 860 exhibits a rising edge 861 in response to the signal 800 matching the reset select voltage 511. The reset signal 860 later exhibits a falling edge 862, as explained below.

Although the inverter 586 responds to the reset signal by inverting it to a binary zero signal, the bias control unit 590 is not responsive to this signal. As explained below, the bias control unit 590 responds to the inverse of the reset signal, i.e., the "trigger" signal.

In response to the reset signal 516 (shown by 860), the ramp signal generator 588 resets the ramp. Particularly, the transistor 610 is turned on and the transistor 611 turned off, bringing the base of the transistor 602 high. Accordingly, the transistor 602 turns on, causing the output capacitor 606 to begin charging.

Figure 8D:
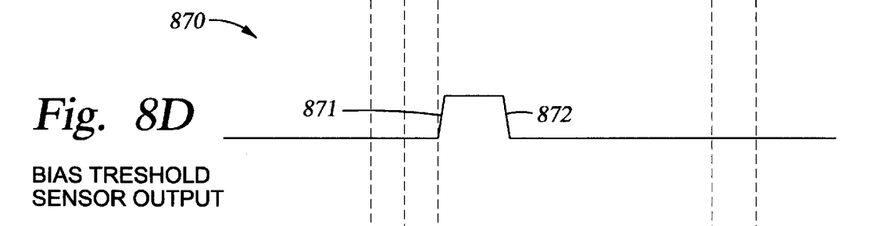
Figure 8E:
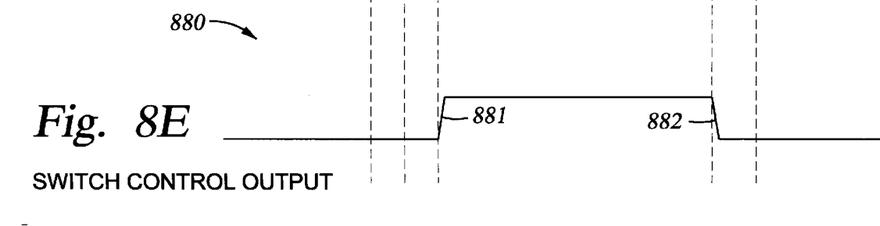

A short time later, the ramp output signal 800 reaches the bias select level 580, as recognized by the bias threshold sensor 582. Accordingly, the sensor 582 provides a binary one output on the line 583, which is supplied to the bias control unit 590. FIG. 8D shows the output signal 870 of the bias threshold sensor 582 on the line 583. The signal 870 exhibits a rising edge 871 in response to the ramp output signal 800 meeting the bias select level 580. A predetermined time later, the signal 870 exhibits a falling edge 872. Thus, the signal 870 comprises a pulse of predetermined duration. The minimum duration of this pulse is the time needed to activate the switch-closed flip-flop 700.

The high signal on the line 583 activates the switch-closed flip-flop 700, which in turn activates the switch-control flip-flop 704. When the output 591 of the switch-control flip-flop 704 goes high, the switch 675 is closed. The output of the switch-control flip-flop 704 is shown by the waveform 880 in FIG. 8E. The switch-control flip-flop output going high is illustrated by the high going transition 881 of the switch control waveform 880. Closing of the switch 675 boosts current through the output transistor 602 speeding the return of the ramp output signal 800 to its predetermined starting level 801 and reducing ringing and overshoot upon the return.

More particularly, as the output capacitor 606 is charged, the output voltage (node 503) increases as shown by the region 808 (FIG. 8A). During this time, the bias current source 675 creates an increased bias current through the transistor 602, lowering the transistor's output impedance. The bias current source 675 also reduces the amount of dynamic current flowing into the output capacitor 606. These features help to decrease overshoot and ringing in the ramp signal 800, as shown in the area 510. Consequently, the ramp signal settles to its steady state value 801 sooner, enabling earlier retriggering. This is especially apparent when the signal 800 is compared to the conventional output signal 300 (FIG. 3), which exhibits undesirable overshoot 308, ringing 309, and slow transition to steady state D.C. voltage 310.

After the ramp output signal 800 returns to its steady state 801, the ramp 502 may be triggered again. As explained above, the ramp is triggered by operating the trigger circuit 517, which provides a binary zero upon the line 516. Unlike the high-going edge of the waveform 860 on line 516, which occurs automatically when the ramp output signal 800 reaches the reset select 511 level, the low-going edge 862 (FIG. 8C) occurs whenever the trigger circuit 517 is activated.

When the trigger circuit 517 is activated, the reset signal 860 returns to zero, exhibiting the falling edge 862. Also in response to the trigger signal, the switch-open flip-flop 702 causes the switch-control flip-flop 704 to provide a zero output, as shown by the falling edge 882 of the switch control signal 880. At this point, the linear descent of the waveform 800 begins anew, repeating the cycle discussed above.

OTHER EMBODIMENTS

While the foregoing disclosure shows a number of illustrative embodiments of the invention, it will be apparent to those skilled in the art that various changes and modifications can be made herein without departing from the scope of the invention as defined by the appended claims. As an example, the analog timing select level 510, bias select level 580, and reset select level 511 need not have the exact relationship shown in FIG. 8A. In fact, these levels may be changed to assume any relative order among themselves, as suitable to the particular application.

Furthermore, although elements of the invention may be described or claimed in the singular, the plural is contemplated unless limitation to the singular is explicitly stated.

What is claimed is:

1. A ramp circuit, comprising:
    an output transistor including a power supply node, an input node, and an output node, the power supply node coupled to a predetermined source voltage;
    an output capacitor coupled between the output node and electrical ground;
    a first output current source coupled between the output node and electrical ground;
    a second current source coupled between the output node and electrical ground, the second current source having a bias control input and being selectively activated in response to an activating signal on the bias control input; and
    a bias control unit coupled to the bias control input to provide the activating signal thereon in response to a predetermined criteria threshold signal.

2. The ramp circuit of claim 1, the output transistor comprising a bipolar junction transistor where the input node, power supply node, and output node are provided by respective base, collector, and emitter nodes.

3. The ramp circuit of claim 1, the second current source comprising a current source and a switch coupled in series, the switch being selectively activated in response to the activating signal.

4. The ramp circuit of claim 3, the switch comprising a transistor.

5. The ramp circuit of claim 1, the bias control unit having a trigger input and a bias threshold input, the bias control unit providing the activating signal to the bias control input responsive to receipt of the predetermined threshold signal at the bias threshold input, the bias control unit terminating provision of the activating signal responsive to receipt of a predetermined signal at the trigger input.

6. The ramp circuit of claim 5, further comprising:
    an input stage coupled to the output transistor's input node, the input stage having an input line and providing an activating signal to the output transistor's input node in response to a predetermined reset signal on the input line; and
    an inverter having an output coupled to the trigger input, the inverter having an input coupled to the input line.

7. The ramp circuit of claim 6, the input stage comprising:
    first and second transistors each having a power supply node, an input node, and an output node, the first and second transistors' output nodes being interconnected;
    a third current source interconnected between electrical ground and the interconnected output nodes of the first and second transistors;
    a resistance device coupled between the second transistor's power supply node and said predetermined source voltage; and
    wherein the first transistor's power supply node is coupled to a reference voltage, the second transistor's power supply node is coupled to the output transistor's input node, the first transistor's input node is coupled to the input line, and the second transistor's input node is coupled to a line providing a signal complementary to the signal present on the input line.

8. The ramp circuit of claim 7, the resistance device comprising a resistor.

9. The ramp circuit of claim 7, said predetermined source voltage comprising one or more positive voltages, the current sources flowing positive electrical current in a direction toward the electrical ground.

10. A ramp circuit, comprising:
    first means having a power supply node, input node, and an output node, for applying a reference voltage from the power supply node to the output node in response to a predetermined signal on an input node;
    second means for storing charge, the second means coupled between the output node and electrical ground;
    third means for providing current, the third means coupled between the output node and electrical ground;
    fourth means for selectively providing current in response to an activating signal on a bias control input, the fourth means coupled between the output node and electrical ground; and
    a bias control means for providing the activating signal to the bias control input in response to a predetermined criteria threshold signal.

11. A timing vernier, comprising:
    a ramp circuit, having an input line and providing a substantially linearly changing output signal at a ramp output node responsive to signals on the input line, the ramp circuit including;
        an output transistor including a power supply node, and input node, and an output node, the power supply node coupled to a predetermined source voltage, the output node being coupled to the ramp output node, the input node being coupled to the input line;

an output capacitor coupled between the output node and electrical ground;

an output current source coupled between the output node and electrical ground;

a second current source interposed between the output node and electrical ground, the second current source having a bias control input and being selectively activated in response to an activating signal on the bias control input; and a bias control unit, having a trigger input, a bias threshold input, and a bias control output coupled, said bias control output coupled to the bias control input, the bias control unit providing the activating signal upon the bias control output responsive to receipt of a first predetermined signal at the bias threshold input, the bias control unit terminating provision of the activating signal responsive to receipt of a second predetermined signal at the trigger input;

a digital-to-analog converter (DAC) responsive to one or more digital inputs to provide analog signals including a timing select signal, a bias select signal, and a reset select signal;

a reset threshold sensor coupled to the ramp and the DAC, providing the second predetermined signal to the both the bias control unit and the input line when the ramp output signal substantially matches the reset select signal;

a bias threshold sensor coupled to the ramp and the DAC, providing the first predetermined signal to the bias control unit when the ramp output signal substantially matches the bias select signal; and a comparator coupled to the ramp and the DAC to produce a predetermined timing event when the ramp output signal substantially matches the timing select signal.

12. The timing vernier of claim 11, the DAC including three input lines, each analog output signal comprising an analog representation of a signal on a different corresponding input line.

13. The timing vernier of claim 11, the timing select, bias select, and reset select signals being substantially equal.

14. The timing vernier of claim 11, the timing select, bias select, and reset select signals being substantially different than each other.

15. The timing vernier of claim 11, two of the timing select, bias select, and reset select signals being substantially equal but different than a remaining one of the signals.

16. The timing vernier of claim 11, the ramp providing a decreasing ramp output signal.

17. The timing vernier of claim 16, the decreasing ramp output signal encountering the analog output signals of the DAC in order of (1) the timing select signal, then (2) the bias select signal, and finally (3) the reset select signal.

18. The timing vernier of claim 11, further including an input stage, interposed between the input line and the output transistor's input node, the input stage providing a digital signal to the output transistor's input node representative of the signal at the input line.

19. The timing vernier of claim 18, the input stage comprising:

first and second transistors each having a power supply node, and input node, and an output node, the first and second transistors' output nodes being interconnected;

a third current source interconnected between electrical ground and the interconnected output nodes of the first and second transistors' a resistance device coupled between the second transistor's power supply node and reference voltage; and wherein the first transistor's power supply node is coupled to a reference voltage, the second transistor's power supply node is coupled to the output transistor's input node, the first transistor's input node is coupled to the input line, and the second transistor's input node is coupled to a line providing a signal complementary to the signal present on the input line.

20. The timing vernier of claim 1, further comprising:

a trigger circuit coupled to the input line, the trigger circuit creating a predetermined voltage upon the input line in response to an input stimulus.

* * * * *

UNITED STATES PATENT AND TRADEMARK OFFICE
CERTIFICATE OF CORRECTION

PATENT NO.   : 5,973,522
DATED        : October 26, 1999
INVENTOR(S)  : Coy et al It is certified that error appears in the above-identified patent and that said Letters Patent is hereby corrected as shown below:

On the title page, item [54] and column 1, line 1-3
    CURRENT INJECTED RAMP WITH REDUCED RECOVERY TIME Signed and Sealed this Second Day of May, 2000

Attest:

Q. TODD DICKINSON

Attesting Officer    Director of Patents and Trademarks

UNITED STATES PATENT AND TRADEMARK OFFICE
CERTIFICATE OF CORRECTION

PATENT NO.   : 5,973,522
DATED        : October 26, 1999
INVENTOR(S)  : Coy et al.

It is certified that error appears in the above-identified patent and that said Letters Patent is hereby corrected as shown below:

<u>Title page,</u>
Item [54], Title, delete "BACKGROUND OF THE INVENTION"

Signed and Sealed this

Twenty-third Day of December, 2003

JAMES E. ROGAN
*Director of the United States Patent and Trademark Office*